United States Patent
Zhang et al.

(10) Patent No.: US 10,303,224 B1
(45) Date of Patent: May 28, 2019

(54) BLADE SERVER

(71) Applicants: INVENTEC (PUDONG) TECHNOLOGY CORPORATION, Shanghai (CN); INVENTEC CORPORATION, Taipei (TW)

(72) Inventors: Song Zhang, Shanghai (CN); Jing Chen, Shanghai (CN); Xiao-Bing Zou, Shanghai (CN); Ping-Wei Peng, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/870,505

(22) Filed: Jan. 12, 2018

(30) Foreign Application Priority Data

Nov. 30, 2017 (CN) .......................... 2017 1 1231769

(51) Int. Cl.
```
H05K 5/00      (2006.01)
G06F 1/18      (2006.01)
G06F 15/16     (2006.01)
G06F 11/20     (2006.01)
```
(52) U.S. Cl.
CPC .......... *G06F 1/183* (2013.01); *G06F 11/2005* (2013.01); *G06F 15/161* (2013.01)

(58) Field of Classification Search
CPC ..... G06F 1/183; G06F 11/2005; G06F 15/162
USPC .......................................................... 361/752
See application file for complete search history.

(56) References Cited

U.S. PATENT DOCUMENTS

| | | | |
|---|---|---|---|
| 7,191,347 B2* | 3/2007 | Bigelow | G06F 1/26 713/300 |
| 7,193,847 B2* | 3/2007 | Liang | H05K 7/1445 16/229 |
| 2007/0186086 A1* | 8/2007 | Lambert | G06F 8/65 713/1 |
| 2008/0320117 A1* | 12/2008 | Johnsen | G06F 11/30 709/221 |
| 2017/0336841 A1* | 11/2017 | Ragupathi | G06F 1/266 |

* cited by examiner

*Primary Examiner* — Hung S. Bui
(74) *Attorney, Agent, or Firm* — Maschoff Brennan

(57) ABSTRACT

A blade server has a casing, a plurality of blade server module boards, a first chassis management controller (CMC) and a second CMC. There are a plurality of main board slots at a first side of the casing and at least a first CMC slot and a second CMC slot at a second side of the casing opposite to the first side. The plurality of main board slots are all electrically connected to both of the first CMC slot and the second CMC slot, wherein the first CMC slot and the second CMC slot are electrically connected to each other. The plurality of blade server module boards are plugged into the plurality of main board slots. The first CMC and the second CMC are redundant to each other. When one of the two CMCs malfunctions, the blade server module boards are controlled by the other one CMC functioning normally.

8 Claims, 9 Drawing Sheets

BLADE SERVER

CROSS-REFERENCE TO RELATED APPLICATIONS

This non-provisional application claims priority under 35 U.S.C. § 119(a) on Patent Application No(s). 201711231769.4 filed in China, on Nov. 30, 2017, the entire contents of which are hereby incorporated by reference.

TECHNICAL FIELD

This invention relates to a blade server, and particularly to a 4U blade server.

BACKGROUND

A conventional server generally has standard elements such as chassis, power, main board, storage medium, and etc. However, one chassis conventionally has only one chassis management controller. Although some servers have more than one chassis management controller in one chassis to control more than one server board, those chassis management controller cannot mutually support. One of those chassis management controllers fails, the server board controlled by that chassis management controller cannot be used by the user.

SUMMARY

In one embodiment of the invention, a blade server has a casing, a plurality of blade server module board, a first chassis management controller (CMC), and a second CMC. The casing has a plurality of main board slots at a first side of the casing and at least a first CMC slot and a second CMC slot at a second side of the casing opposite to the first side, wherein the plurality of main board slots are all electrically connected to the first CMC slot and the second CMC slot, and the first CMC slot is electrically connected to the second CMC slot. The plurality of blade server module boards are plugged in the plurality of main board slots. The first CMC is plugged in the first CMC slot to be electrically connected to the plurality of blade server module boards. The second CMC is plugged in the second CMC slot to be electrically connected to the first CMC and the plurality of blade server module boards, wherein the second CMC detects the first CMC to generate a detection signal based on whether the first CMC functions normally. When the first CMC functions normally, the plurality of blade server module boards is controlled by the first CMC based on the detection signal, and controlled by the second CMC based on the detection signal otherwise.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
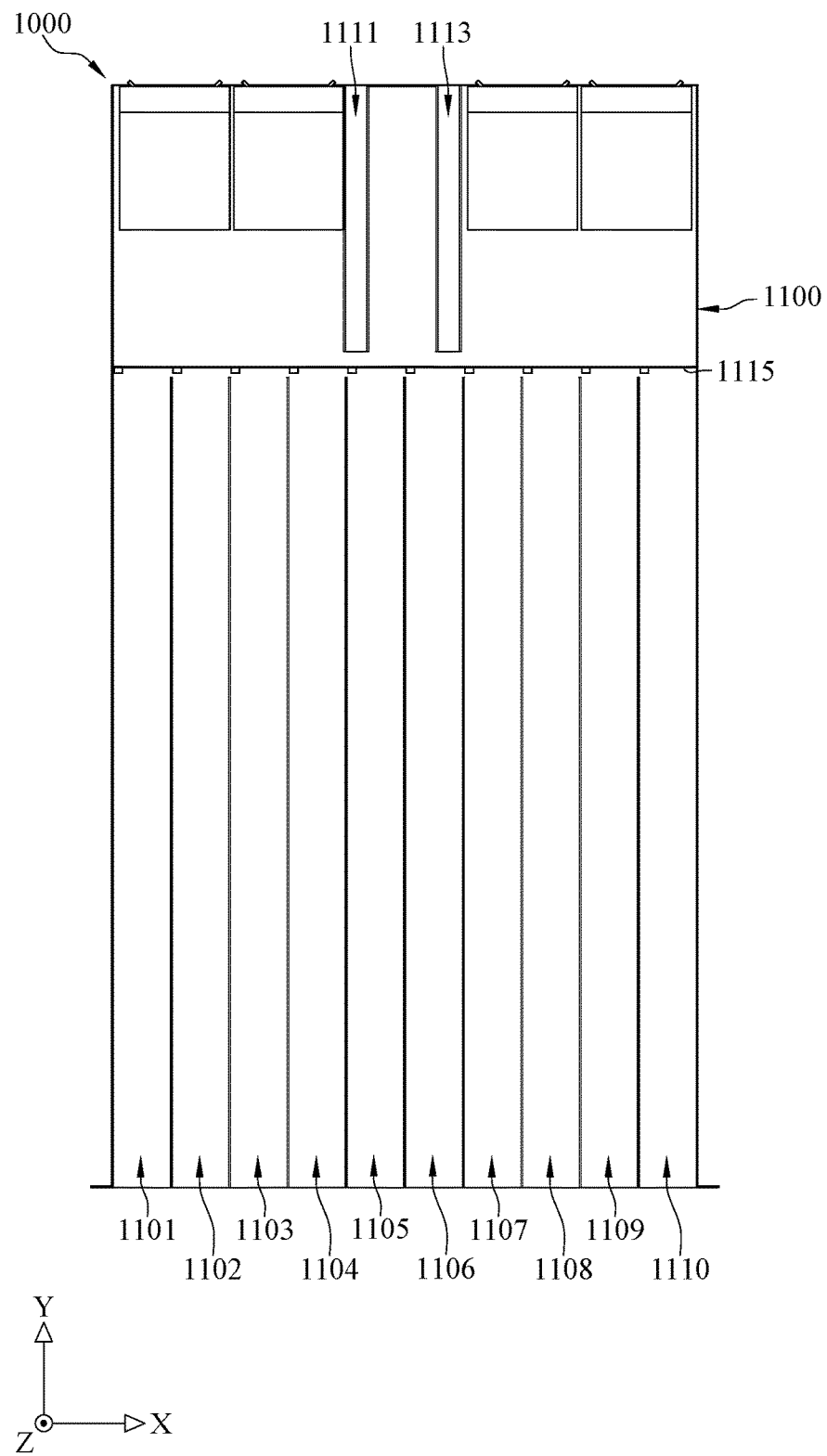
FIGS. 1A and 1B are top views of a blade server in one embodiment of the invention.
Figure 1B:
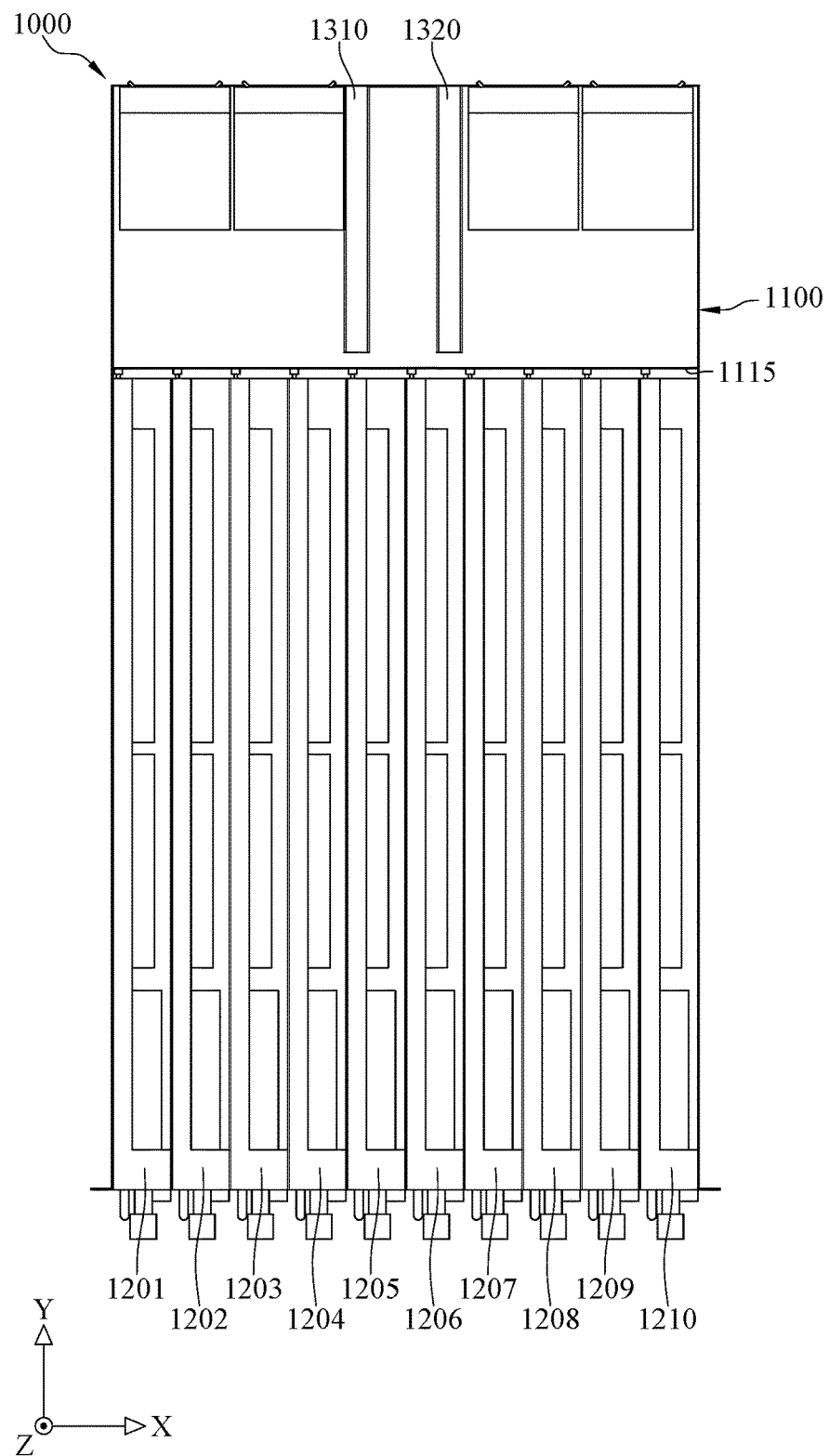
Figure 1C:
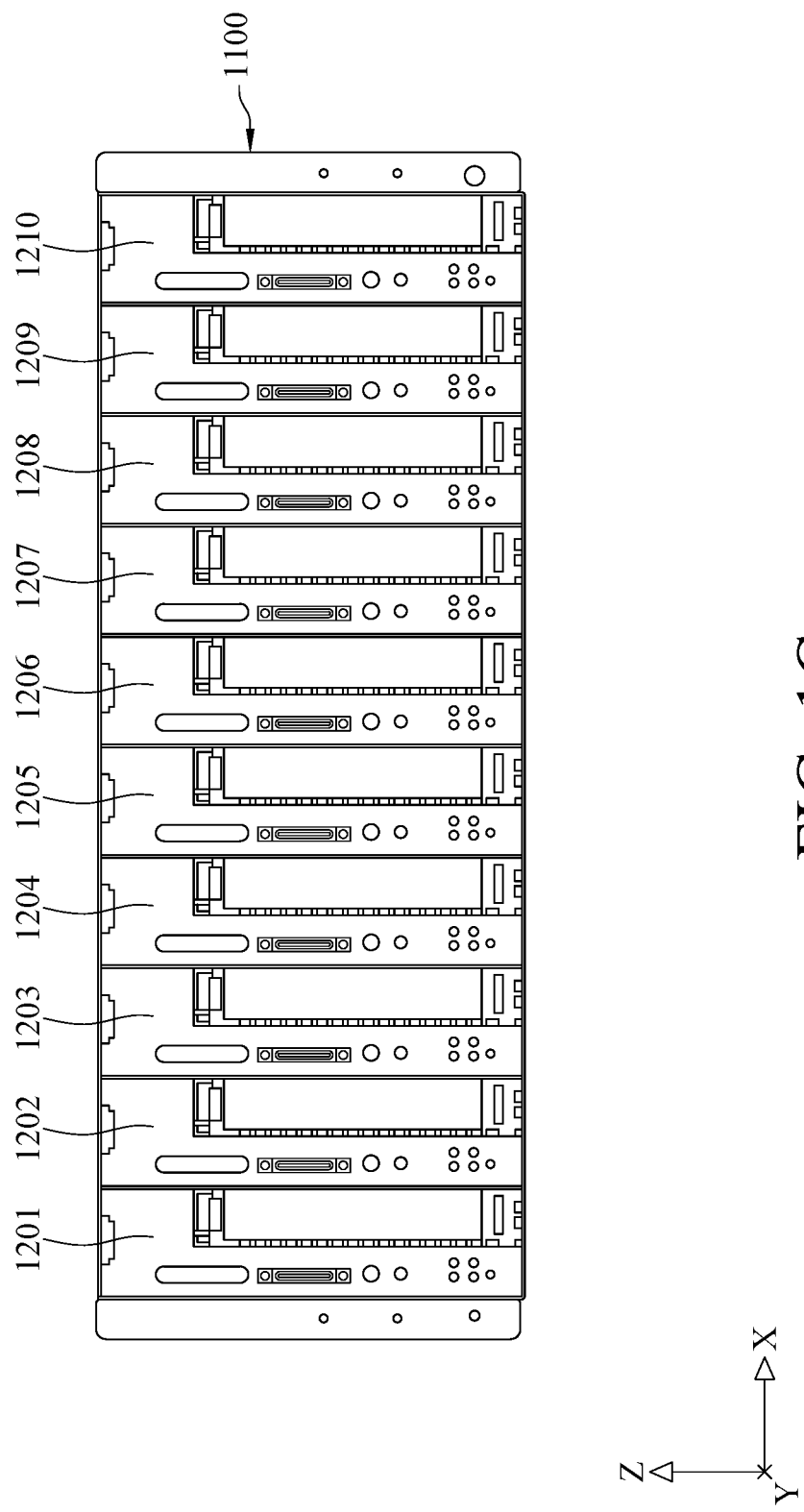
FIG. 1C is a front view of the blade server in FIG. 1A.
Figure 1D:
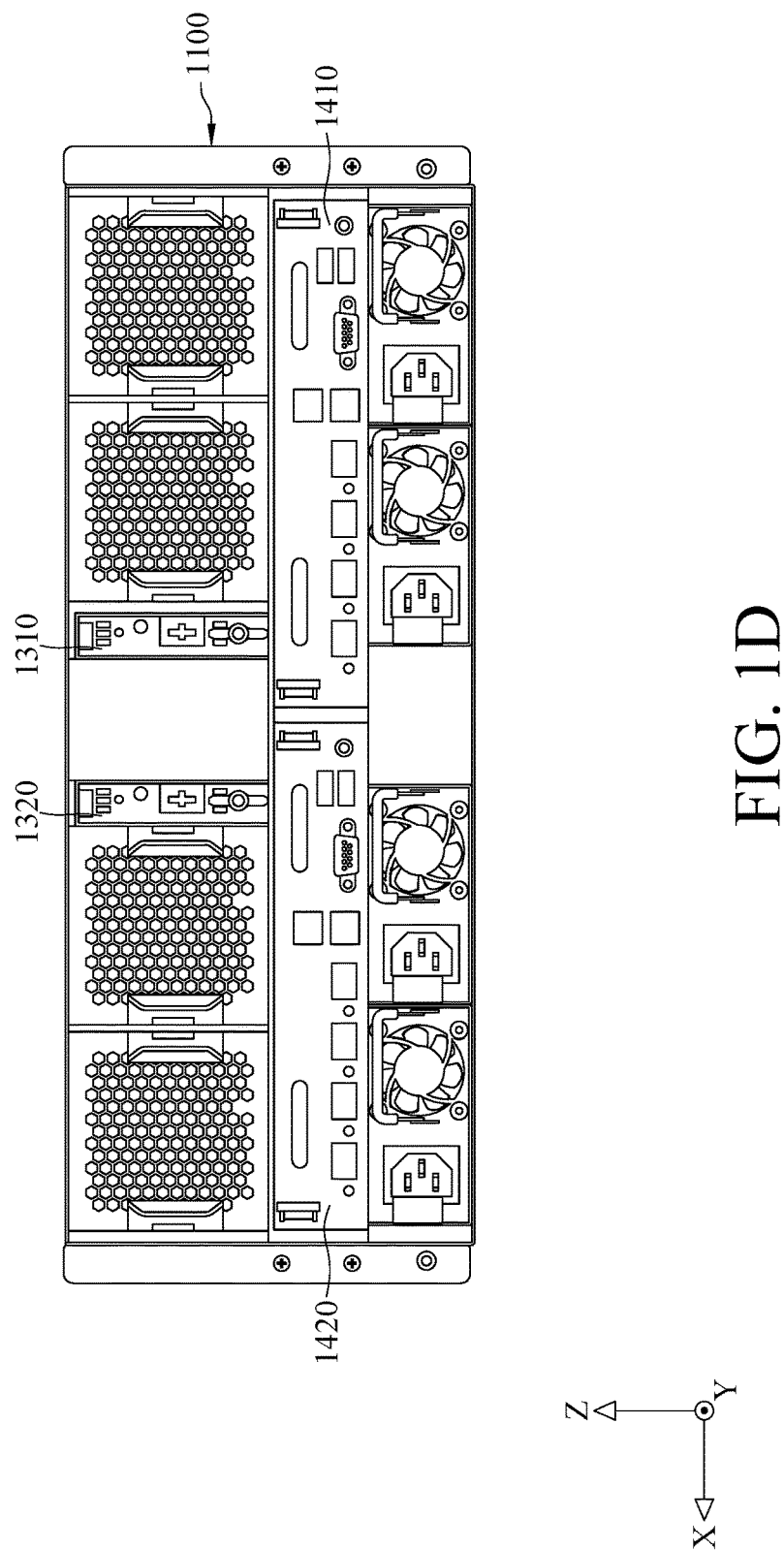
FIG. 1D is a back view of the blade server in FIG. 1A.

Please refer to FIG. 1A through FIG. 1D, wherein FIGS. 1A and 1B are top views of a blade server in one embodiment of the invention, FIG. 1C is a front view of the blade server in FIG. 1A, and FIG. 1D is a back view of the blade server in FIG. 1A. As shown in FIG. 1A~FIG. 1D, a blade server 1000 in one embodiment of the invention has a casing 1100, a plurality of blade server module boards 1201~1210, a first chassis management controller (CMC) 1310 and a second CMC 1320. In FIG. 1A through FIG. 1D, please refer to the auxiliary coordinates system X-Y-Z. In the following embodiment, the direction of negative X-axis is defined as the left side of the blade server, the direction of positive X-axis is defined as the right side of the blade server, the direction of negative Y-axis is defined as the first side of the blade server, the direction of positive Y-axis is defined as the second side of the blade server, the direction of negative Z-axis is defined as the bottom of the blade server, and the direction of positive Z-axis is defined as the upper side of the blade server.

There are a plurality of main board slots 1101~1110 at the first side of the casing 1100 and at least a first CMC slot 1111 and a second CMC slot 1113 at the second side of the casing 1100. The plurality of main board slots 1101~1110 are all electrically connected to both of the first CMC slot 1111 and the second CMC slot 1113. The first CMC slot 1111 and the second CMC slot 1113 are electrically connected to each other.

In one embodiment, the electrical connection between each of the main board slots 1101~1110 and both of the first CMC slot 1111 and the second CMC slot 1113 is implemented by the mid-plane 1115. When the blade server 1000 is assembled, the mid plane 1115 is inserted into the casing 1100 from upper side to bottom, so the mid-plane 1115 is respectively electrically connected to the main board slots 1101~1110, the first CMC slot 1111 and the second CMC slot 1113. Hence, the main board slot 1101~1110 is electrically connected to the first CMC slot 1111 and the second CMC slot 1113 via the mid-plane 1115.

The plurality of blade server module boards 1201~1210 are plugged into the plurality of main board slots 1101~1110.

The first CMC 1310 is plugged into the first CMC slot 1111 so as to be electrically connected to the plurality of blade server module boards 1201~1210. The second CMC 1320 is plugged into the second CMC slot 1113 so as to be electrically connected to the first CMC 1310 and the plurality of blade server module board 1201~1210.

Figure 2:
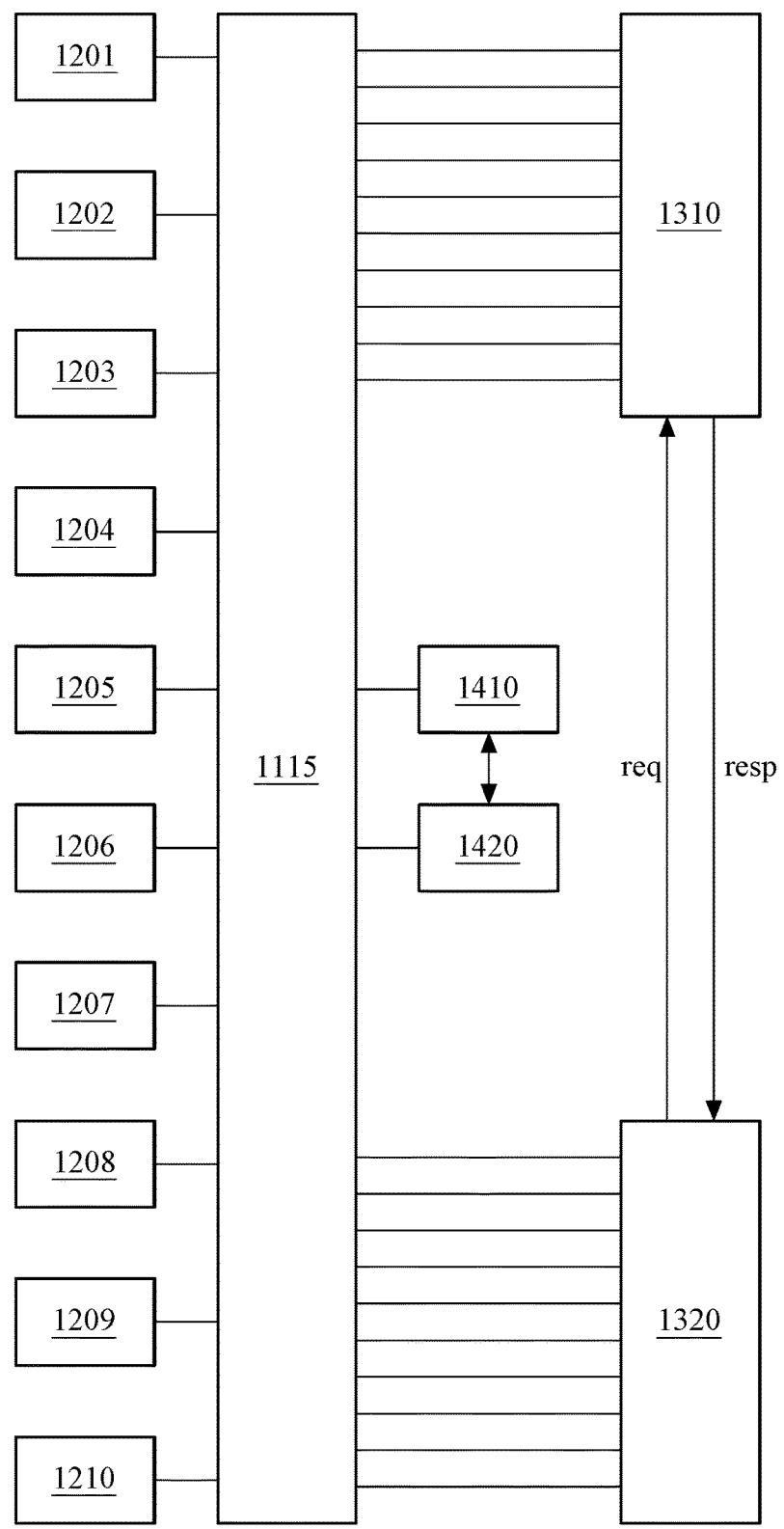
FIG. 2 is a block diagram of the blade server in one embodiment of the invention.

Please refer to FIG. 2, which is a block diagram of the blade server in one embodiment of the invention. As shown in FIG. 2, the first CMC 1310 and the second CMC 1320 of the blade server 1000 are both electrically connected to the blade server module boards 1201~1210 via the mid-plane 1115. In the embodiment in FIG. 2, the second CMC 1320 is the redundant of the first CMC 1310. Explicitly, the second CMC 1320 detects the operation status of the first CMC 1310 and generates a corresponding detection signal Vdet based on whether the first CMC 1310 functions normally.

How the second CMC 1320 detects the operation status of the first CMC 1310 is explained in the following. In one embodiment, the second CMC 1320 periodically or randomly sends a request signal req to the first CMC 1310. The request signal req, for example, request for certain data. If the second CMC 1320 does not receive the response packet resp from the first CMC 1310 in a period after the request signal is sent, the second CMC 1320 determines the first CMC 1310 malfunctioning. If the second CMC 1320 receives the response packet resp from the first CMC 1310 in time, the second CMC 1320 determines the first CMC 1320 functioning normally. In another embodiment, the second CMC 1320 further verifies whether the response packet resp from the first CMC 1310 is correct or not so as to determine whether the first CMC 1310 functions normally. In addition, one having ordinary skill in the art is capable designing how the second CMC 1320 detects whether the first CMC 1310 functions normally, and the invention does not limit thereto.

In one embodiment, when the first CMC 1310 functions normally, the detection signal Vdet generated by the second CMC 1320 is, for example, at high voltage. When the first CMC 1310 malfunctions, the detection signal Vdet is, for example, at low voltage. When the detection signal Vdet is at high voltage, the blade server module boards 1201~1210 is controlled by the first CMC 1310. When the detection signal Vdet is at low voltage, the blade server module boards 1201~1210 is controlled by the second CMC 1320.

In another embodiment, the blade server module boards 1201~1205 are, for example, primarily controlled by the first CMC 1310, and the blade server module boards 1206~1210 are, for example, primarily controlled by the second CMC 1320. The first CMC 1310 also detects whether the second CMC 1320 functions normally. Explicitly, in the aforementioned embodiment, the second CMC 1320 sends a request signal req to the first CMC 1310, and waits for the response packet resp from the first CMC 1310. In this embodiment, the response packet resp sent from the first CMC 1310 is, for example, a request signal from the first CMC 1310 to the second CMC 1320, and the request signal req sent from the second CMC 1320 is identified by the first CMC 1310 as the response packet from the second CMC 1320 to the first CMC 1310. When the second CMC 1320 detects the first CMC 1310 malfunctioning, the second CMC 1320 controls the blade server module boards 1201~1205 to be controlled by the second CMC 1320. On the contrary, when the first CMC 1310 detects the second CMC 1320 malfunctioning, the first CMC 1310 controls the blade server module boards 1206~1210 to be controlled by the first CMC 1310.

In one embodiment, please go back to FIG. 1A~FIG. 1D. There are furtherly a first switch slot and a second switch slot electrically connected to the main board slots 1101~1110 at the second side of the casing 1100. There is a first switch 1410 plugged in the first switch slot, and the first switch 1410 is electrically connected to the blade server module boards 1201~1210 plugged in the main board slots 1101~1110 via the first switch slot and the mid-plane 1115. There is a second switch 1420 plugged in the second switch slot, and the second switch 1420 is electrically connected to the blade server module boards 1201~1210 plugged in the main board slots 1101~1110 via the second switch slot and the mid-plane 1115. Please refer to FIG. 2. As shown in FIG. 2, the first switch 1410 and the second switch 1420 are both electrically connected to the blade server module boards 1201~1210 via the mid-plane 111. Explicitly, the first switch 1410 and the second switch 1420 are, for example, configured to serve each of the blade server module boards 1201~1210 with the network communication ability or other communication ability. Further, one of the first switch 1410 and the second switch 1420 fails, the blade server module boards 1201~1210 use the other one thereof to send signal so that it is prevented that the blade server module boards lose the communication ability while one switch fails.

Figure 3:
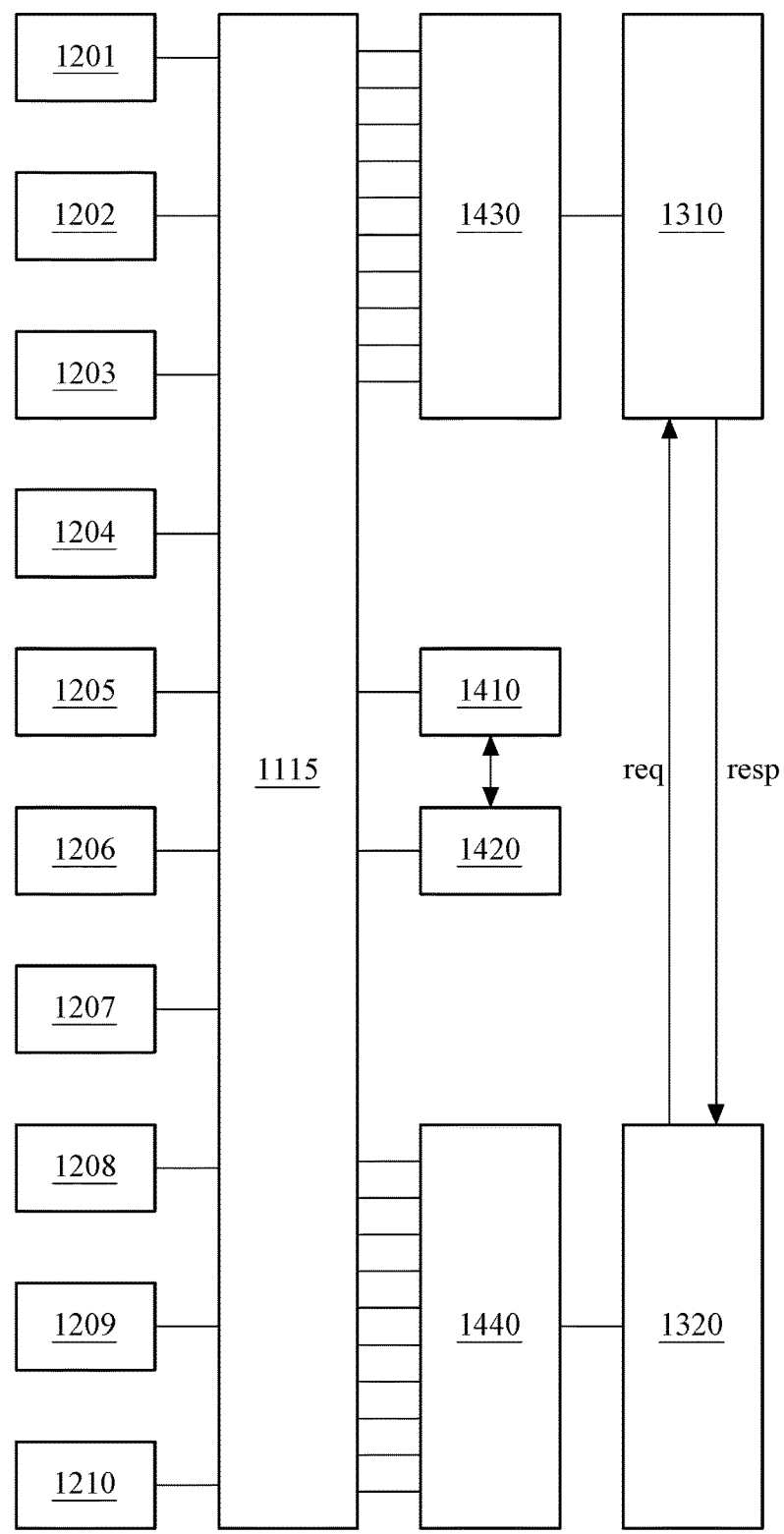
FIG. 3 is a functional block diagram of the blade server in another embodiment of the invention.

In another embodiment, please refer to FIG. 3, which is a functional block diagram of the blade server in another embodiment of the invention. As shown in FIG. 3, the blade server 1000', compared with the embodiment in FIG. 2, further has a third switch 1430 and a fourth switch 1440. The third switch 1430 is electrically connected to the first CMC 1310 and the blade server module boards 1201~1210. The third switch 1430 is configured to perform the signal transmission between the first CMC 1310 and one of the blade server module boards 1201~1210. The fourth switch 1440 is electrically connected to the second CMC 1320 and the blade server module boards 1201~1210, and configured to perform the signal transmission between the second CMC 1320 and one of the blade server module boards 1201~1210.

Figure 4:
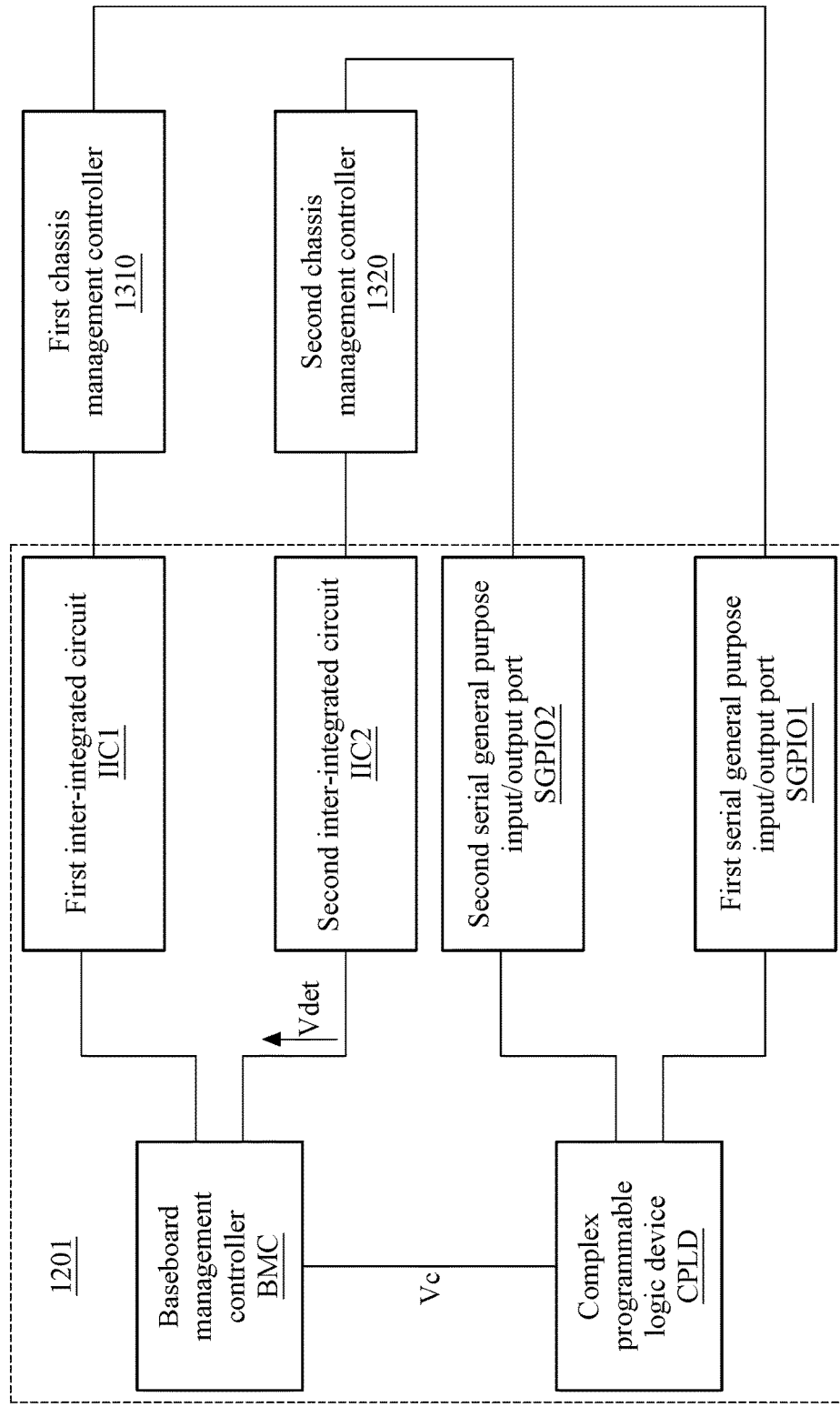
FIG. 4 is a functional block diagram of the blade server module board in one embodiment of the invention.

Please then refer to FIG. 4, which is a functional block diagram of the blade server module board in one embodiment of the invention. As shown in FIG. 4, taking the blade server module board 1201 for example, the blade server module board 1201 has a baseboard management controller BMC, a first inter-integrated circuit IIC1 and a second IIC2. The first inter-integrated circuit IIC1 is respectively electrically connected to the baseboard management controller BMC and the first CMC 1310, and the second inter-integrated circuit IIC2 is respectively electrically connected to the baseboard management controller BMC and the second CMC 1320. In one embodiment, the baseboard management controller BMC receives the detection signal Vdet via the second inter-integrated circuit IIC2, and selects one of the first inter-integrated circuit IIC1 and the second inter-integrated circuit IIC2 to receive and/or send signal based on the detection signal Vdet. In another embodiment, the second CMC 1320 has additional one pin electrically connected to the baseboard management controller BMC via the mid-plane 1115. The baseboard management controller BMC selects one of the first inter-integrated circuit IIC1 and the second inter-integrated circuit IIC2 to receive and/or send signal based on the detection signal Vdet from this pin.

In one embodiment, the blade server module board 1201 is further electrically connected to the complex programmable logic device CPLD of the baseboard management controller BMC. The complex programmable logic device CPLD has a first serial general purpose input/output port SGPIO1 and a second serial general purpose input/output port SGPIO2. The complex programmable logic device CPLD is electrically connected to the first CMC 1310 via the first serial general purpose input/output port SGPIO1 and to the second CMC 1320 via the second serial general purpose input/output port SGPIO2. The baseboard management controller BMC generates a corresponding control signal Vc based on the detection signal Vdet to control the complex programmable logic device CPLD either to communicate with the first CMC 1310 via the first serial general purpose input/output port SGPIO1 or to communicate with the second CMC 1320 via the second serial general purpose input/output port SGPIO2.

Figure 5:
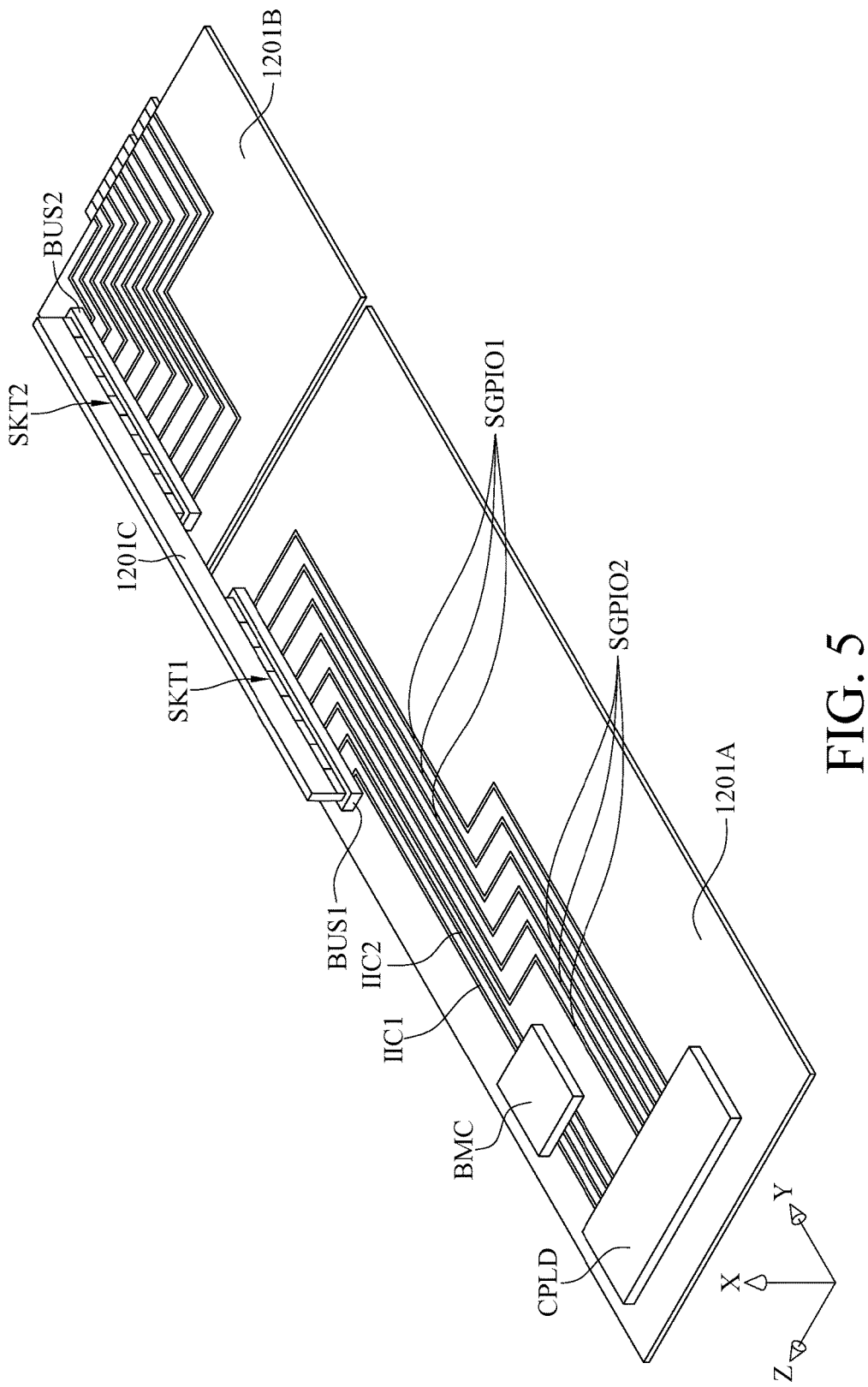
FIG. 5 is an architecture of the blade server module board in one embodiment of the invention.

In one embodiment, the invention further provides an architecture of the blade server module board. Please refer to FIG. 5, which is an architecture of the blade server module board in one embodiment of the invention. As shown in FIG. 5, taking the blade server module board 1201 for example, the blade server module board 1201 has a first baseboard 1201A, a second baseboard 1201B, and a bridging board 1201C. The first baseboard 1201A has a first bridging bus BUS1. The second baseboard 1201B is configured to be plugged in the corresponding main board slot so as to be electrically connected to the first CMC 1310 and the second CMC 1320. The second baseboard 1201B has a second bridging bus BUS2. The bridging board 1201C has a first socket SKT1 and a second socket SKT2, the first socket SKT1 is pluggably connected to the first bridging bus BUS1 and the second socket SKT2 is pluggably connected to the second bridging bus BUS2. The baseboard management controller BMC, the first inter-integrated circuit IIC1, and the second inter-integrated circuit IIC2 are all disposed on the first baseboard 1201A. The first inter-integrated circuit IIC1 and the second inter-integrated circuit IIC2 are respective electrically connected to the first CMC 1310 and the second CMC 1320 via the bridging board 1201C and the second baseboard 1201B. Practically, there are a variety models of the blade server module board. The thickness of the baseboard and the pin count of one model of the blade server module board are different from those of another one model. In this embodiment, the blade server module board, no matter what the specification of its first baseboard is, the second baseboard with unified specification is used for being pluggably connected to the main board slot.

Figure 6:
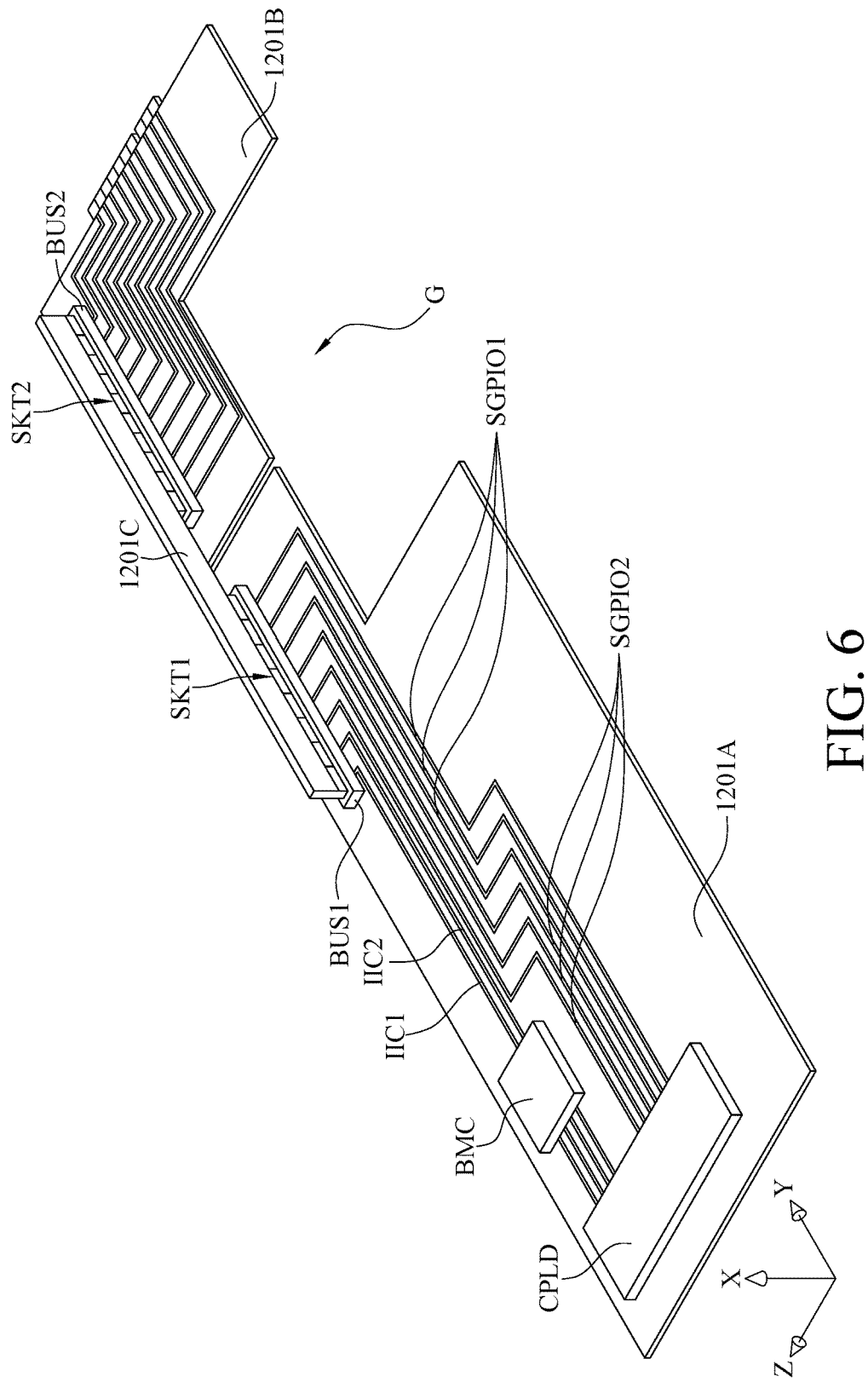
FIG. 6 is an architecture of the blade server module board in another embodiment of the invention.

In one embodiment, as shown in FIG. 6, this embodiment is different from the embodiment in FIG. 5 at that there is a gap G between the first baseboard 1201A and the second baseboard 1201B. The gap G is a room for a specific electronic element such as a hard disk backplane in one embodiment.

As above, in one embodiment of the invention, the second CMC detects whether the first CMC functions normally so as to make the blade server module boards controlled by either the first CMC or the second CMC based on the detection result. Hence, when the first CMC malfunctions or needs to be repaired, the blade server module boards in the same blade server can be temporarily controlled by the second CMC functioning normally.

What is claimed is:

1. A blade server, comprising:
a casing having a plurality of main board slots at a first side of the casing and at least a first chassis management controller (CMC) slot and a second CMC slot at a second side of the casing opposite to the first side, wherein the plurality of main board slots are all electrically connected to the first CMC slot and the second CMC slot, and the first CMC slot is electrically connected to the second CMC slot;
a plurality of blade server module board plugged in the plurality of main board slots;
a first CMC plugged in the first CMC slot to be electrically connected to the plurality of blade server module boards;
a second CMC plugged in the second CMC slot to be electrically connected to the first CMC and the plurality of blade server module boards, wherein the second CMC detects the first CMC to generate a detection signal based on whether the first CMC functions normally;
a third switch electrically connected to the first CMC and the plurality of blade server module boards, and configured to perform a signal transmission between one among the plurality of blade server module boards and the first CMC; and
a fourth switch electrically connected to the second CMC and the plurality of blade server module boards, and configure to perform a signal transmission between one among the plurality of blade server module boards and the second CMC,
wherein when the first CMC functions normally, the plurality of blade server module boards is controlled by the first CMC based on the detection signal, and controlled by the second CMC based on the detection signal otherwise.

2. The blade server in claim 1, further comprising:
a first switch slot at the second side of the casing and electrically connected to the plurality of main board slots;
a second switch slot at the second side of the casing and electrically connected to the plurality of main board slots;
a first switch plugged into the first switch slot to be electrically connected to the plurality of blade server module boards; and
a second switch plugged into the second switch slot to be electrically connected to the plurality of blade server module boards;
wherein when one of the first switch and the second switch fails, the plurality of blade server module boards send signal via the other one of the first switch and the second switch.

3. The blade server in claim 1, wherein each of the blade server module boards comprises:
a baseboard management controller (BMC);
a first inter-integrated circuit ($I^2C$) respectively electrically connected to the BMC and the first CMC; and
a second $I^2C$ respectively electrically connected to the BMC and the second CMC;
wherein the BMC selects one of the first $I^2C$ and the second $I^2C$ to receive or send signal based on the detection signal.

4. The blade server in claim 3, wherein each of the blade server module boards further comprises:
a complex programmable logic device (CPLD) electrically connected to the baseboard management controller, wherein the CPLD comprises:
a first serial general purpose input/output (SGPIO) port electrically connected to the first CMC; and
a second SGPIO port electrically connected to the second CMC;
wherein the BMC controls the CPLD to receive or send signal via either the first SGPIO port or the second SGPIO port based on the detection signal.

5. The blade server in claim 3, wherein each of the blade server module boards further comprises:
a first baseboard has a first bridging bus;
a second baseboard configured to pluggably connected to the corresponding main board slot to be electrically connected to the first CMC and the second CMC, wherein the second baseboard has a second bridging bus; and a bridging board having a first socket pluggably connected to the first bridging bus and a second socket pluggably connected to the second bridging bus;

wherein the BMC, the first I²C and the second I²C are all on the first baseboard, and the first I²C and the second I²C are electrically connected to the first CMC and the second CMC via the bridging board and the second baseboard.

6. The blade server in claim 5, wherein a gap between the first baseboard and the second baseboard forms a room for an electronic element.

7. The blade server in claim 6, wherein the electronic element is a hard disk backplane.

8. The blade server in claim 1, further comprising a mid-plane in the casing and respectively electrically connected to the plurality of main board slots, the first CMC slot and the second CMC slot, wherein the plurality of main board slots are electrically connected to the first CMC slot and the second CMC slot via the mid-plane.

* * * * *